Nov. 22, 1966 B. K. ERICKSON 3,287,652
PUSH-PULL AMPLIFIER CIRCUIT HAVING AN INDUCTIVE LOAD AND METHOD FOR OBTAINING A SYMMETRICAL GAIN
Filed March 27, 1964
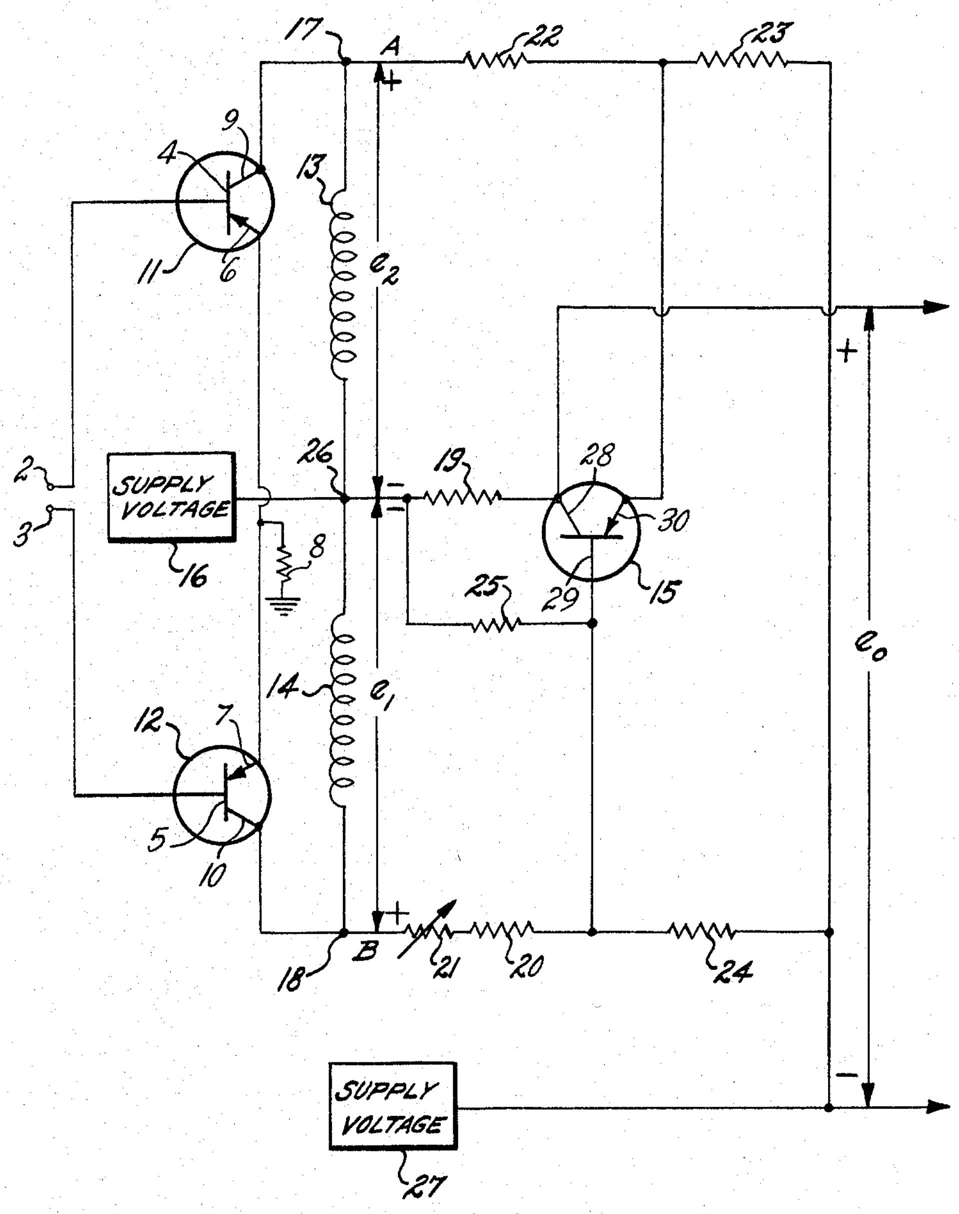
INVENTOR.
BERT K. ERICKSON
BY Wade Koontz and George Fine
ATTORNEYS United States Patent Office 3,287,652
Patented Nov. 22, 1966

3,287,652

PUSH-PULL AMPLIFIER CIRCUIT HAVING AN INDUCTIVE LOAD AND METHOD FOR OBTAINING A SYMMETRICAL GAIN

Bert K. Erickson, Fayetteville, N.Y., assignor to the United States of America as represented by the Secretary of the Air Force Filed Mar. 27, 1964, Ser. No. 355,520
3 Claims. (Cl. 330—14)

This invention relates on a push-pull amplifier circuit and, more particularly, to a push-pull amplifier circuit that converts the output into a single ended form.

The invention has applications where push-pull amplifiers are connected directly to an inductive load such as a servo motor where feedback signal must be supplied to the amplifier. The circuit described in this invention replaces an isolating transfromer.

The purpose of this circuit is to convert the output of a push-pull low frequency amplifier into a single ended form that is more suitable for driving feedback networks and measuring devices. At the present time power type transistors are being used quite frequently in the push-pull connection to drive inductive type loads. Loud speakers, servo motors, and synchro resolvers form typical loads and many of them can be connected directly without using a matching transformer. Most of the better amplifiers employ some form of feedback to stabilize the gain and to reduce distortion. With a push-pull amplifier, this feedback signal can be obtained with an isolating transformer or a feedback winding within the device. Most of the inductive devices that were originally driven by tubes now have windings for transistor voltages, but very few have feedback windings. One way to obtain a feedback signal is to connect a coupling capacitor to one side of the push-pull output, but the two halves of this signal will not necessarily reproduce the output. This invention replaces the isolating transformer which has performance limitations.

It is an object of this invention to provide a push-pull amplifier circuit having feedback but eliminating an isolating transformer.

It is another object to provide a push-pull amplifier circuit that converts the output to a single ended form for driving feedback network and measuring devices.

Other objects and features of this invention will become more apparent by reference to the following description when taken in conjunction with the accompanying drawing which shows a push-pull amplifier circuit for obtaining a feedback signal from the control field terminals of a 2 phase servo motor.

The cost of the components for this invention can be compared with cost of a small isolating transformer or an optional feedback winding. From a performance standpoint, the frequency response is flat from zero to possible 50 kc. The frequency response of a good transformer covers the range from 20 cycles to about 20 kc. This range and the shape at the high frequency end must be considered when designing a feedback amplifier. The desirable frequency response, the simplicity, and the reliability indicate that this circuit be used in several applications.

Referring to the drawing, transistor 11 and transistor 12 form part of a typical push-pull output stage. The input at points 2 and 3 is connected to base 4 and base 5 of transistors 11 and 12. The emitters 6 and 7 are grounded through resistor 8. The resistance of the load windings 13 and 14 will normally be very low and the quiescent current for transistor 15 can be obtained from the supply voltage source 16 used to drive the output transistors 11 and 12. Suitable bias voltages are obtained by direct coupling to points 17 and 18. This arrangement eliminates the need for coupling capacitors and additional power supplies. Points 17 and 18, connected to collectors 9 and 10 of transistors 11 and 12, will develop output voltage that change equal and opposite amounts with respect to the common supply voltage from source 16. Since the sum of these voltages will always be the same, one side must be inverted before the varying component can be detected. This inversion is accomplished by the common emitter section of transistor 15, while no polarity change occurs in the common base section. $e_2$ the voltage between point 26 and point 17 is fed to base 29 and emitter 30 and output $e_0$ is taken from collector 28 and emitter 30 via resistor 23 and hence this section of transistor 15 has a common emitter which configuration inverts the input signal. $e_1$ the voltage between point 26 and point 18 is fed to emitter 30 and base 29 of transistor 15 and the output $e_0$ is taken from collector 28 and base 29 via resistor 24. This section of transistor 15 therefore has a common base configuration. The output signal is developed across load resistor 19 ($R_L$) connected between point 26 and collector 28 of transistor 15. This signal is proportional to the voltage between points 17 and 18 and has the advantage of being single ended with respect to the supply voltage.

Resistors 20–25 are used to bias and balance the circuit for symmetrical gain. Resistor 20 ($R_1$) and variable resistor 21 ($R_2$) are connected in series between point 18 and the base of transistor 15. Resistor 22 ($R_3$) is connected between point 17 and the emitter of transistor 15. Resistor 23 ($R_4$) and resistor 24 ($R_5$) are in series connection between the emitter and base of transistor 15. Register 25 ($R_6$) is connected between point 26 and the base of transistor 15. Degenerative feedback occurs through resistor 23 which eliminates variations of transistor parameters.

The output voltage in terms of the inputs designated as $e_1$ and $e_2$, can be expressed as $$e_0 \approx \frac{aR_L[e_2R_4(R_1+R_2+R_7)-e_1R_7(R_3+R_4)]}{R_3(R_1+R_2+R_7)(R_4+r_e)+(1-a)(R_3+R_4)[r_b(R_1+R_2+R_7)+R_7(R_1+R_2)]}$$

where $$R_7=\frac{R_5R_6}{R_5+R_6}$$

$$a=\text{amplification factor}\left(\frac{I_c}{I_e}\right)$$

$r_e$ = the emitter resistance $r_b$ = tne base resistance

Note symmetrical gain will exist when $$\frac{R_1+R_2}{R_7}=\frac{R_3}{R_4}$$

This condition is set by disconnecting point 17 and and attaching it to point 18. Then with a nominal output signal applied, $R_2$ (variable resistor 21) is adjusted until $e_0$ has a null value.

As an example, this circuit was connected to the output of a 400-cycle servo motor driven by a transistor amplifier. The output was connected to a 3300-ohm load and other components had the following values after the null adjustment.

$$R_1+R_2=5300$$
$$R_1=768$$
$$R_3=4700$$
$$R_4=680$$
$$R_5=1000$$
$$R_6=3300$$
$$R_7=768$$
$$\frac{R_1+R_2}{R_7}=6.90$$
$$\frac{R_3}{R_4}=6.91$$

For the given operating point $$r_e \approx 1.5$$
$$r_b \approx 210$$
$$1-a \approx 0.015$$
$$a \approx 0.985$$
$$\frac{e_o}{e_2-e_1}=0.155$$

This value has been determined by measurement in which $$\frac{e_o}{e_2-e_1}=\frac{3.1}{20}=0.155$$

Under these conditions the circuit was virtually independent of transistor parameters.

What is claimed is:

1. A single ended push-pull amplifier circuit for driving an inductive load comprising:

a first and second transistor of like type each having a collector, emitter, and base;

an inductive load connected to the collector of said first and second transistor;

a supply voltage source connected at the midpoint of said inductive load;

a third transistor having a collector, emitter and base for inverting one half of the inductive load, one half of the inductive load being connected to the third resistor in a common emitter configuration and the other half being connected in a common base configuration with the emitter and base being resistively connected to the collectors of the first and second transistors; and a load resistor connected to the midpoint of said load and to said third transistor for developing a single ended output.

2. A single ended push-pull amplifier circuit for driving an inductive load according to claim 1 which further comprises a variable biasing resistor interposed between the collector of the second transistor and the base of the third transistor.

3. A method of producing a symmetrical gain from a push-pull amplifier having a single ended form while obtaining a feedback signal for driving an inductive load comprising:

connecting an inductive load to the collectors of the push-pull transistors with a supply voltage source at the midpoint of the inductive load;

connecting a load resistor between the supply voltage source and the collector of an inverting transistor one half of the inductive load being connected to the inverting transistor in a common emitter configuration and the other half being connected in a common base configuration;

connecting biasing resistors to the emitter and base of the inverting transistor one biasing resistor being variable and the other being fixed; and balancing the amplifier circuit to obtain symmetrical gain by disconnecting the fixed biasing resistor at one end of the inductive load, connecting the fixed biasing resistor to the opposite end of the inductive load, and adjusting a variable biasing resistor to create a null value at the load resistor.

References Cited by the Examiner

UNITED STATES PATENTS

| | | | |
|---|---|---|---|
| 2,221,398 | 11/1940 | Geohegan | 330—116 |
| 2,266,531 | 12/1941 | Bedford | 330—116 X |
| 2,296,920 | 9/1942 | Goodale | 330—116 X |
| 3,068,420 | 12/1962 | Smith. | |
| 3,185,932 | 5/1965 | Walker et al. | 330—15 |

ROY LAKE, *Primary Examiner.*

F. D. PARIS, *Assistant Examiner.*